United States Patent
Noebauer et al.

(10) Patent No.: US 10,068,848 B2
(45) Date of Patent: *Sep. 4, 2018

(54) SEMICONDUCTOR CHIP WITH INTEGRATED SERIES RESISTANCES

(71) Applicant: Infineon Technologies Austria AG, Villach (AT)

(72) Inventors: Gerhard Noebauer, Villach (AT); Ralf Siemieniec, Villach (AT); Maximilian Roesch, St. Magdalen (AT); Martin Poelzl, Ossiach (AT); Michael Hutzler, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 15/404,261

(22) Filed: Jan. 12, 2017

(65) Prior Publication Data

US 2017/0125345 A1    May 4, 2017

Related U.S. Application Data

(63) Continuation of application No. 13/970,162, filed on Aug. 19, 2013, now Pat. No. 9,570,553.

(51) Int. Cl.
*H01L 29/76* (2006.01)
*H01L 29/94* (2006.01)
(Continued)

(52) U.S. Cl.
CPC .... *H01L 23/5228* (2013.01); *H01L 23/53271* (2013.01); *H01L 29/0696* (2013.01);
(Continued)

(58) Field of Classification Search
CPC ....... H01L 29/7813; H01L 2924/13091; H01L 29/1095; H01L 29/402; H01L 29/7827;
(Continued)

(56) References Cited

U.S. PATENT DOCUMENTS 7,319,256 B1 * 1/2008 Kraft ............... H01L 21/823437
257/330
9,570,553 B2 * 2/2017 Noebauer ......... H01L 29/66333
(Continued)

FOREIGN PATENT DOCUMENTS

CN    102184918 A    9/2011
JP    H01166564 A    6/1989

OTHER PUBLICATIONS

Foster, D. W. et al., "An In-Situ Phosphorus Doped Polysilicon Deposition Process Optimization for Production", IEEE V-MIC Conference, Jun. 9-10, 1986, pp. 523-529.

*Primary Examiner* — Marcos D Pizarro
*Assistant Examiner* — Nelson Garces
(74) *Attorney, Agent, or Firm* — Murphy, Bilak & Homiller, PLLC

(57) ABSTRACT

A semiconductor chip has a semiconductor body with a bottom side and a top side arranged distant from the bottom side in a vertical direction, an active and a non-active transistor region, a drift region formed in the semiconductor body, a contact terminal for externally contacting the semiconductor chip, and a plurality of transistor cells formed in the semiconductor body. Each of the transistor cells has a first electrode. Each of a plurality of connection lines electrically connects another one of the first electrodes to the contact terminal at a connecting location of the respective connection line. Each of the connection lines includes a resistance section formed of a locally increased specific resistance relative to a specific resistance of adjacent semiconductor material or metal of the respective connection line. Each of the connecting locations and each of the resistance sections is arranged in the non-active transistor region.

20 Claims, 18 Drawing Sheets

(51) Int. Cl.

| | |
|---|---|
| *H01L 31/062* | (2012.01) |
| *H01L 31/113* | (2006.01) |
| *H01L 27/06* | (2006.01) |
| *H01L 29/06* | (2006.01) |
| *H01L 29/78* | (2006.01) |
| *H01L 29/66* | (2006.01) |
| *H01L 29/40* | (2006.01) |
| *H01L 29/423* | (2006.01) |
| *H01L 29/49* | (2006.01) |
| *H01L 23/522* | (2006.01) |
| *H01L 29/10* | (2006.01) |
| *H01L 23/532* | (2006.01) |
| *H01L 29/417* | (2006.01) |

(52) U.S. Cl.
CPC ........ *H01L 29/1095* (2013.01); *H01L 29/401* (2013.01); *H01L 29/402* (2013.01); *H01L 29/41766* (2013.01); *H01L 29/7802* (2013.01)

(58) Field of Classification Search
CPC ........... H01L 29/7811; H01L 29/41766; H01L 29/4236; H01L 29/0634; H01L 29/0619; H01L 29/407; H01L 29/66734; H01L 29/7802; H01L 2924/13055; H01L 29/7397
USPC .................................................. 257/325–335
See application file for complete search history.

(56) References Cited

U.S. PATENT DOCUMENTS

| | | |
|---|---|---|
| 2005/0194635 A1 | 9/2005 | Pfirsch |
| 2007/0138544 A1 | 6/2007 | Hirler et al. |
| 2008/0017920 A1 | 1/2008 | Sapp et al. |
| 2010/0102871 A1 | 4/2010 | Werner |
| 2010/0258855 A1 | 10/2010 | Yilmaz et al. |
| 2014/0084295 A1 | 3/2014 | Hirler et al. |

\* cited by examiner

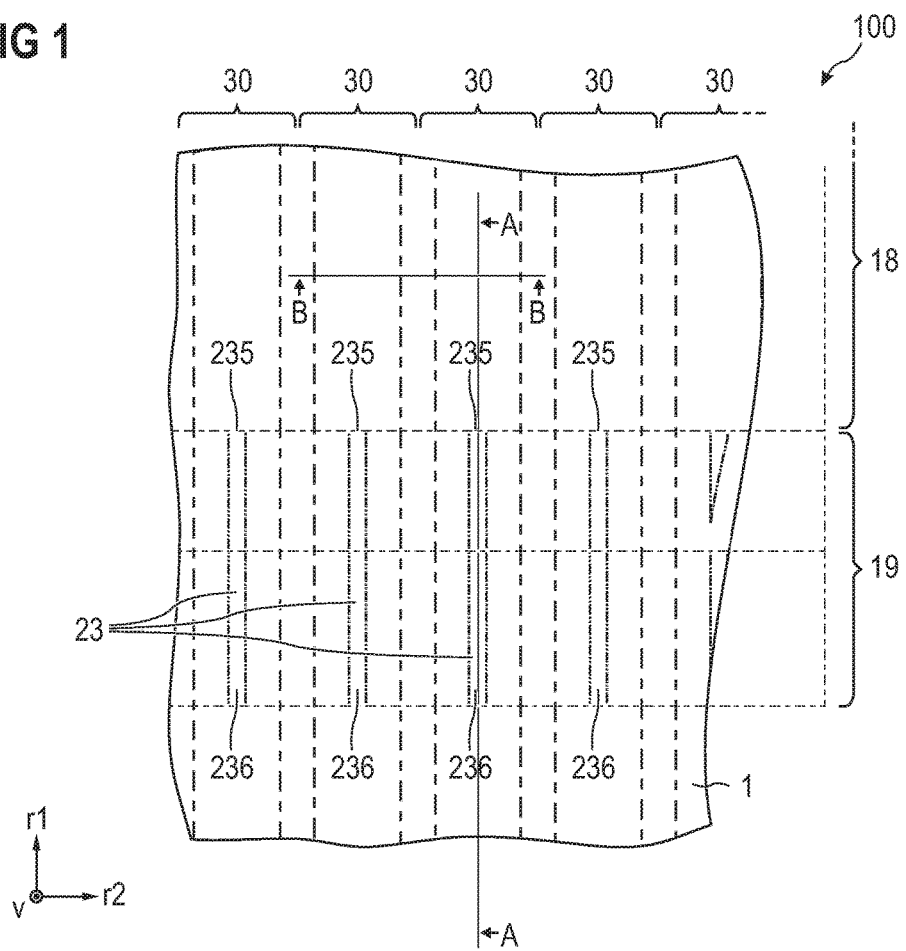
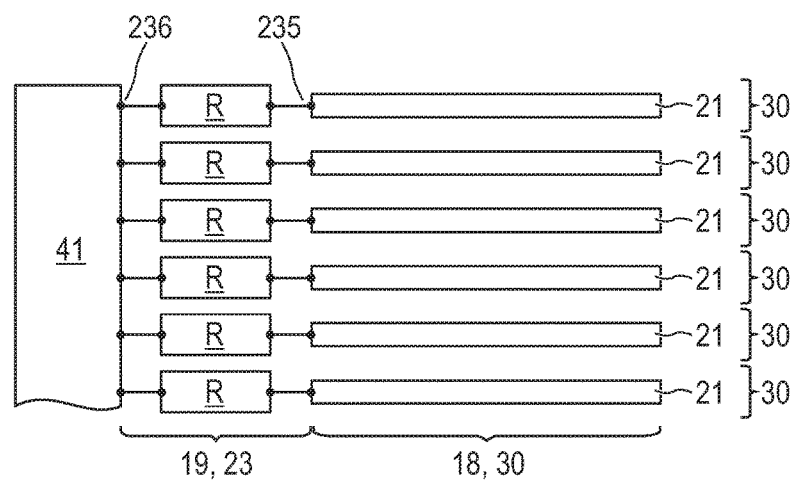

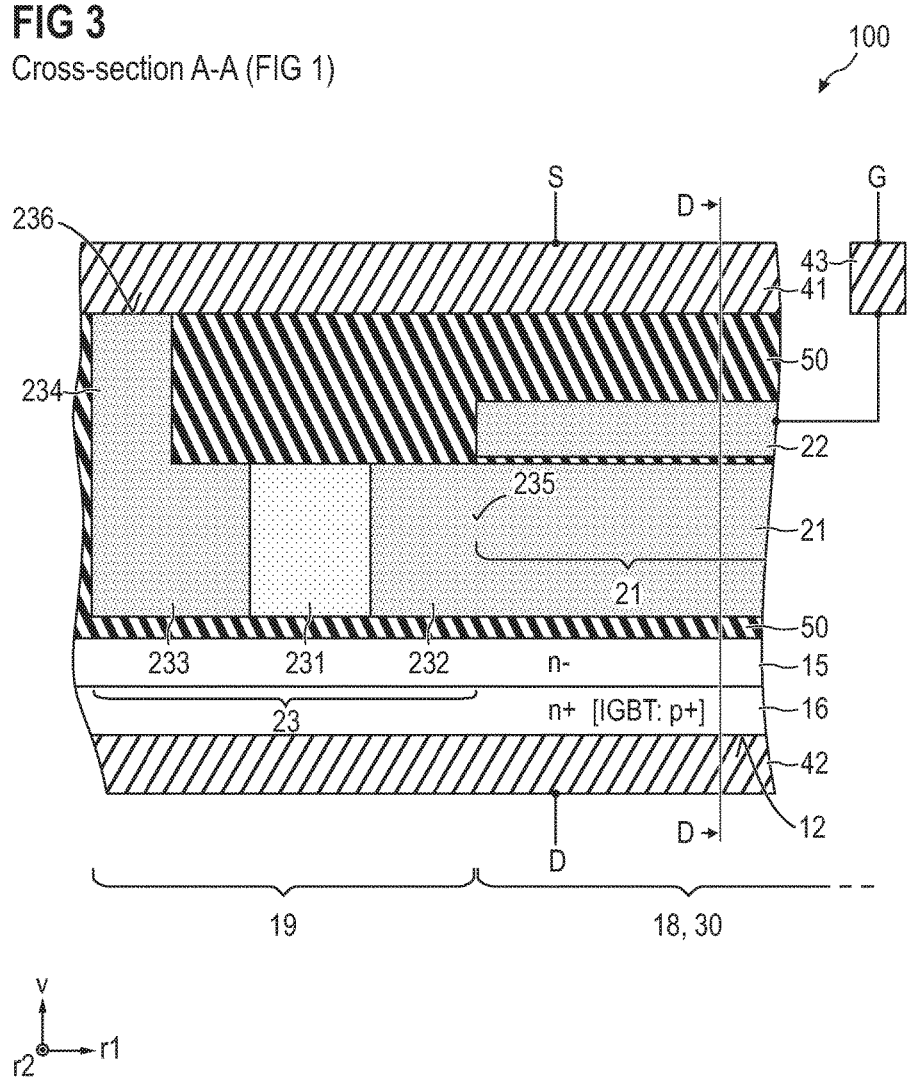

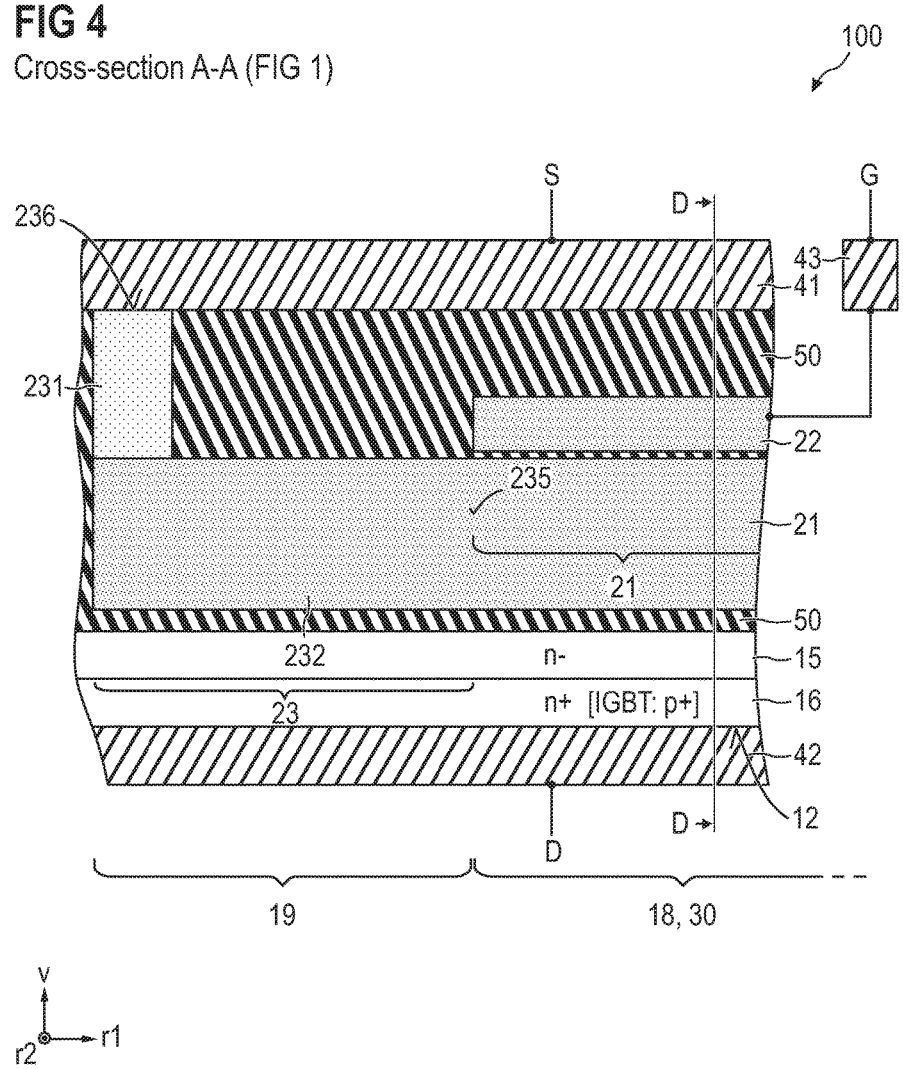

Cross-section A-A (FIG 1)

Cross-section C-C (FIG 5)

Cross-section B-B (FIG 1) and E-E (FIGS 8, 12)

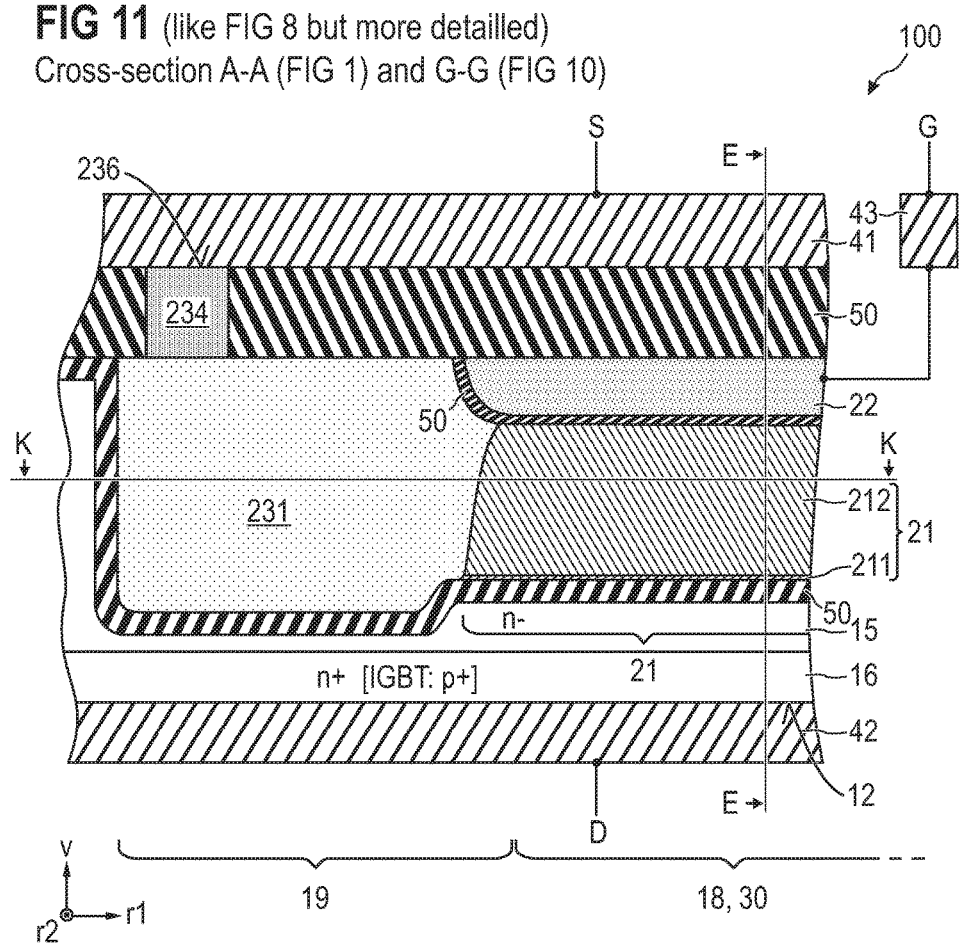
FIG 11 (like FIG 8 but more detailed)
Cross-section A-A (FIG 1) and G-G (FIG 10)
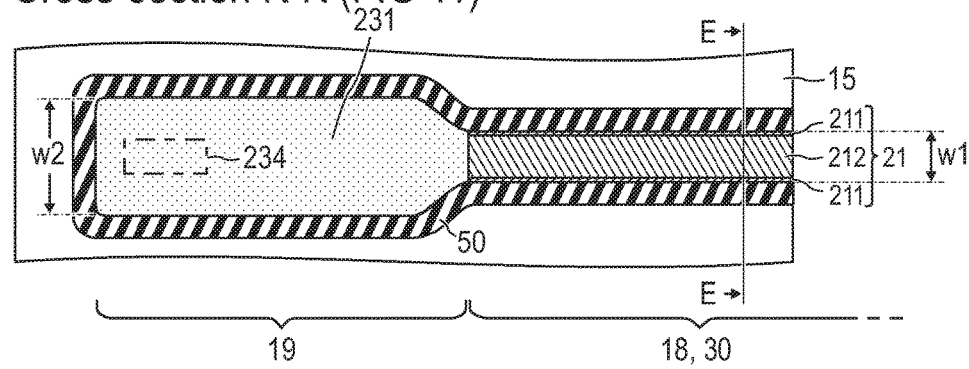
FIG 12
Cross-section K-K (FIG 11)

Cross-section A-A (FIG 1)

FIG 15
Cross-section A-A (FIG 1)
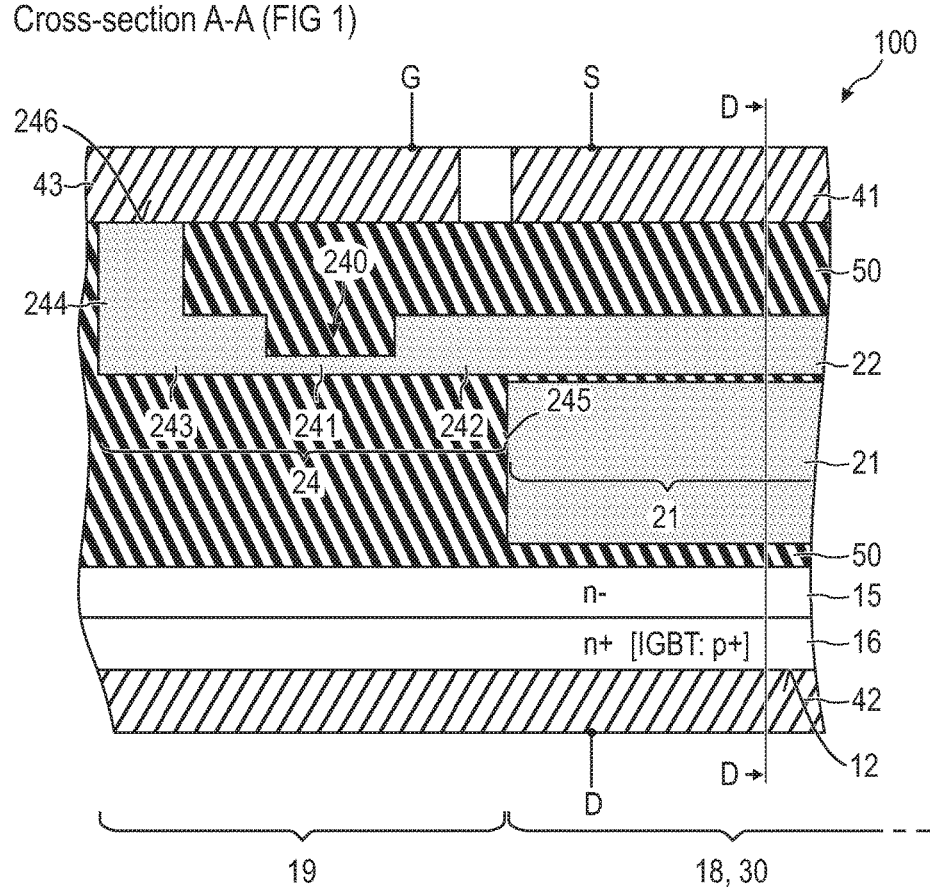
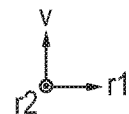

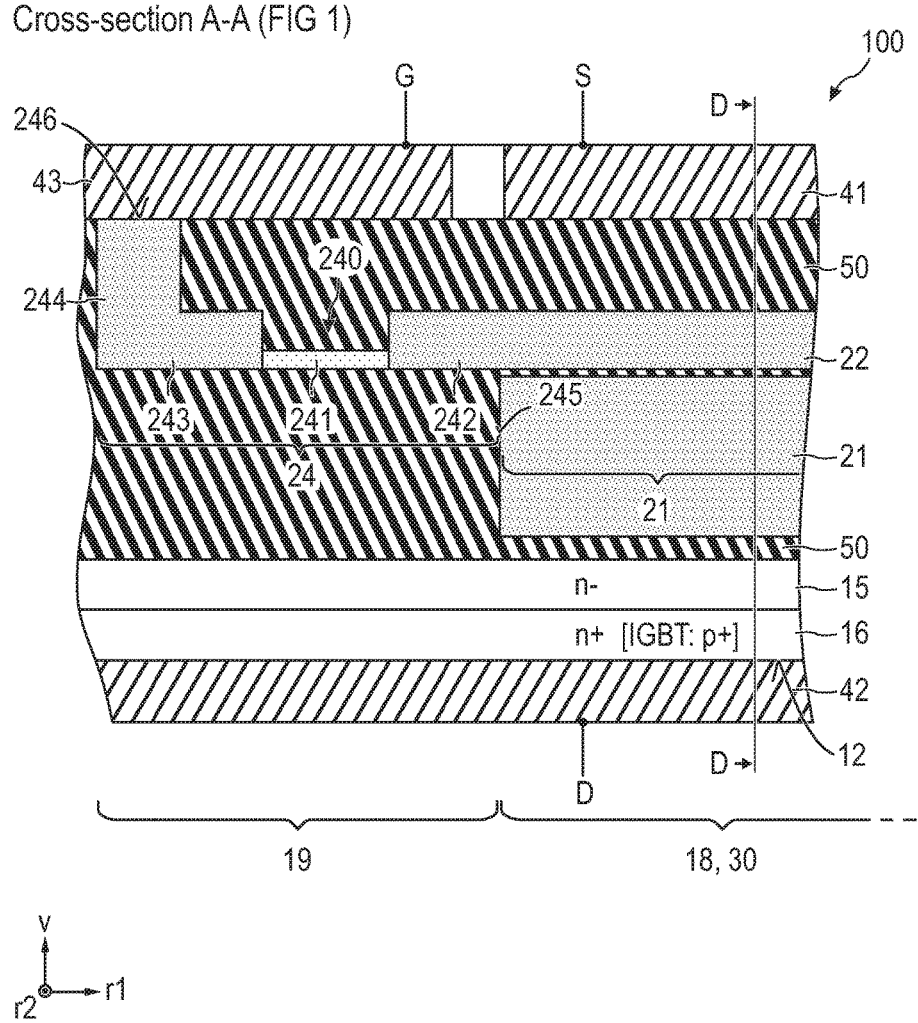

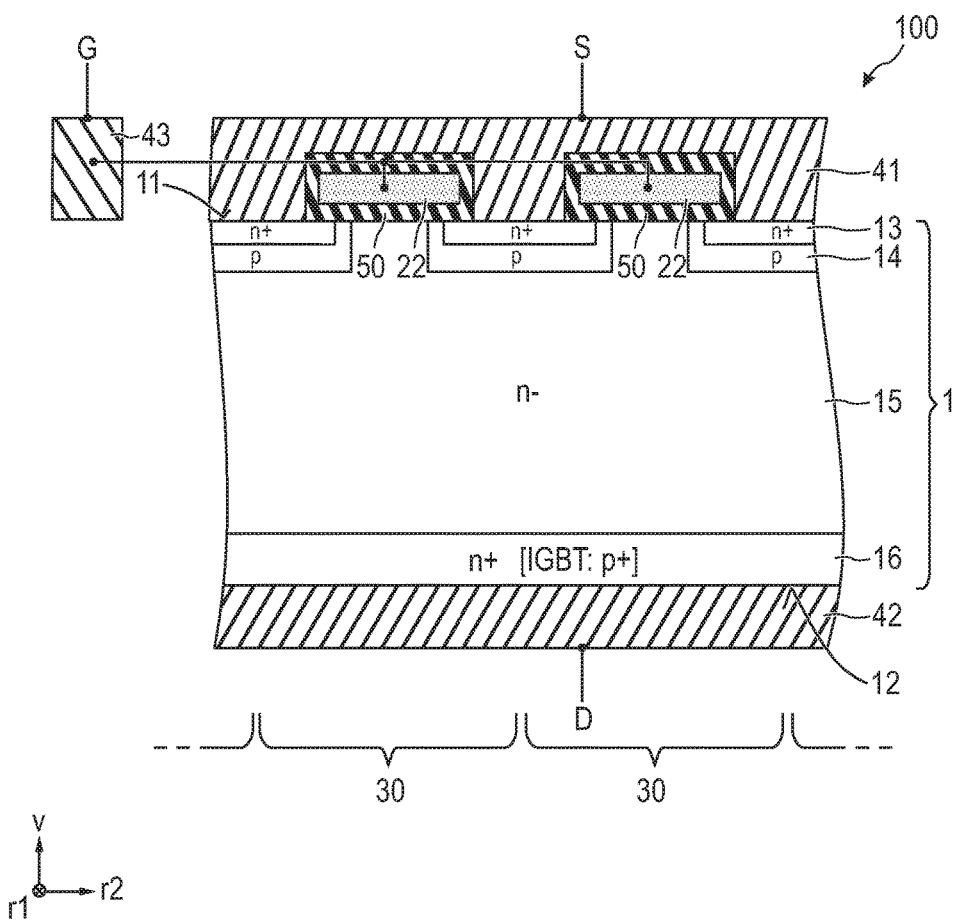

Cross-section K-K (FIG 18A)

Cross-section K-K (FIG 19A)

Cross-section K-K (FIG 20A)

Cross-section K-K (FIG 21A)

Cross-section K-K (FIG 22A)

US 10,068,848 B2

SEMICONDUCTOR CHIP WITH INTEGRATED SERIES RESISTANCES

PRIORITY CLAIM

This application is a continuation of and claims priority to U.S. patent application Ser. No. 13/970,162 filed on Aug. 19, 2013, the content of said application incorporated herein by reference in its entirety.

TECHNICAL FIELD

Embodiments of the present invention relate to a semiconductor chip, in particular a semiconductor chip having a plurality of transistor cells.

BACKGROUND

Transistors, such as IGFETs (insulated gate field effect transistors), which include MOSFETs and IGBTs, are widely used as electronic switches in different kinds of applications, such as inverters, voltage regulators, current regulators, or drive circuits for driving electric loads, such as lamps, valves, motors, etc. Transistors that are commonly employed as power transistors include a plurality of identical transistors cells arranged in a transistor cell field and electrically connected in parallel.

In many modern power transistors, vertical field plates taking advantage of the "charge compensation principle" are used for achieving a low on-resistance ($R_{ON}$) of the transistor. In the charge "compensation principle," field plates, which are electrically connected to a source zone or to an emitter zone of the transistor, extend into the drift zone of the transistor in order to compensate charges provided by dopants that cause the type of conductivity (n or p) of the drift zone. However, the field plates result in an increase of the output capacitance of such transistors. As a consequence thereof, switching the transistor alternately on and off leads to undesired over-voltage peaks caused by unavoidable inductances of an electronic circuit to which the transistor is connected. As the height of the over-voltage peaks increases with the slew rate of the electric current through the transistor, conventional transistors seek to reduce the slew rate using a damping resistor connected in series with the field plates, which, in view of the required high ampacity of that resistor, wastes a lot of chip space. Further, the switching behaviour of the transistor cells of such a transistor is inhomogeneous, that is, the transistor cells do not switch simultaneously on and off.

Therefore, there is a need for a transistor with a low on-resistance, a low output capacity and a homogeneous switching behaviour.

SUMMARY

According to an embodiment, a semiconductor chip has a semiconductor body with a bottom side and with a top side arranged distant from the bottom side in a vertical direction. The semiconductor chip further has an active transistor region with the transistor cells, and a non-active transistor region without transistor cells. The semiconductor chip further includes a drift region formed in the semiconductor body, one or more contact terminal pads for externally contacting the semiconductor chip, and a number of transistor cells formed in the semiconductor body. Each of the transistor cells has a first electrode. Each of a number of connection lines electrically connects another one of the first electrodes to the contact terminal pad at a connecting location of the respective connection line. Each of the connection lines comprises a resistance section wherein each of the connecting locations and each of the resistance sections is arranged in the non-active transistor region. Each of the resistance sections is formed of at least one of a locally reduced cross-sectional area of the connection line section and/or a locally increased specific resistance.

Each of the first electrodes may be a field electrode of another one of the transistor cells. Alternatively, each of the first electrodes may be a gate electrode of another one of the transistor cells.

According to another embodiment, a method for producing a semiconductor chip includes providing a semiconductor body with a bottom side and with a top side arranged distant from the bottom side in a vertical direction. An active transistor region and a non-active transistor region are produced in the semiconductor body such that the semiconductor body comprises as integrated parts a drift region, a contact terminal for externally contacting the semiconductor chip; and a plurality of transistor cells. Each of the transistor cells comprises a first electrode. A plurality of connection lines electrically connect another one of the first electrodes to the contact terminal pad at a connecting location of the respective connection line, wherein each of the connection lines comprises a resistance section formed of at least one of a locally reduced cross-sectional area, and a locally increased specific resistance. Each of the connecting locations and each of the resistance sections is arranged in the non-active transistor region.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1 depicts a top view an embodiment of a semiconductor body of a transistor that illustrates the arrangement of the transistor cells and the resistance sections.

FIG. 2 illustrates the wiring of the first electrodes and the connection lines with the integrated resistance sections of the embodiment illustrated in FIG. 1, wherein the first electrodes are electrically connected, via respective connection lines, to a common source electrode.

FIG. 3 depicts a vertical cross-sectional view of a section of the arrangement of FIG. 1 having the wiring of FIG. 2, in a sectional plane A-A, illustrating a first example for realizing the resistance sections.

FIG. 4 depicts a vertical cross-sectional view of a section of the arrangement of FIG. 1 having the wiring of FIG. 2, in a sectional plane A-A, illustrating a second example for realizing the resistance sections.

FIG. 11 depicts a more detailed illustration of the embodiment of FIG. 8 and relates to vertical cross-sectional views of FIG. 1 in a sectional plane A-A or of FIGS. 8 and 12 in a sectional plane G-G, respectively.

FIG. 12 depicts a horizontal cross-sectional view of the arrangement illustrated in FIG. 11 in a sectional plane K-K.

FIG. 15 depicts a vertical cross-sectional view of a section of the arrangement of FIG. 1 having the wiring of FIG. 13, in a sectional plane A-A, illustrating a second example for realizing the resistance sections.

FIG. 16 depicts a vertical cross-sectional view of a section of the arrangement of FIG. 1 having the wiring of FIG. 13, in a sectional plane A-A, illustrating a third example for realizing the resistance sections.

FIG. 17 depicts a vertical cross-sectional view of a semiconductor chip that has planar gate electrodes arranged above the semiconductor body, and no field electrodes for realizing a compensation component.

DETAILED DESCRIPTION

Figure 5:
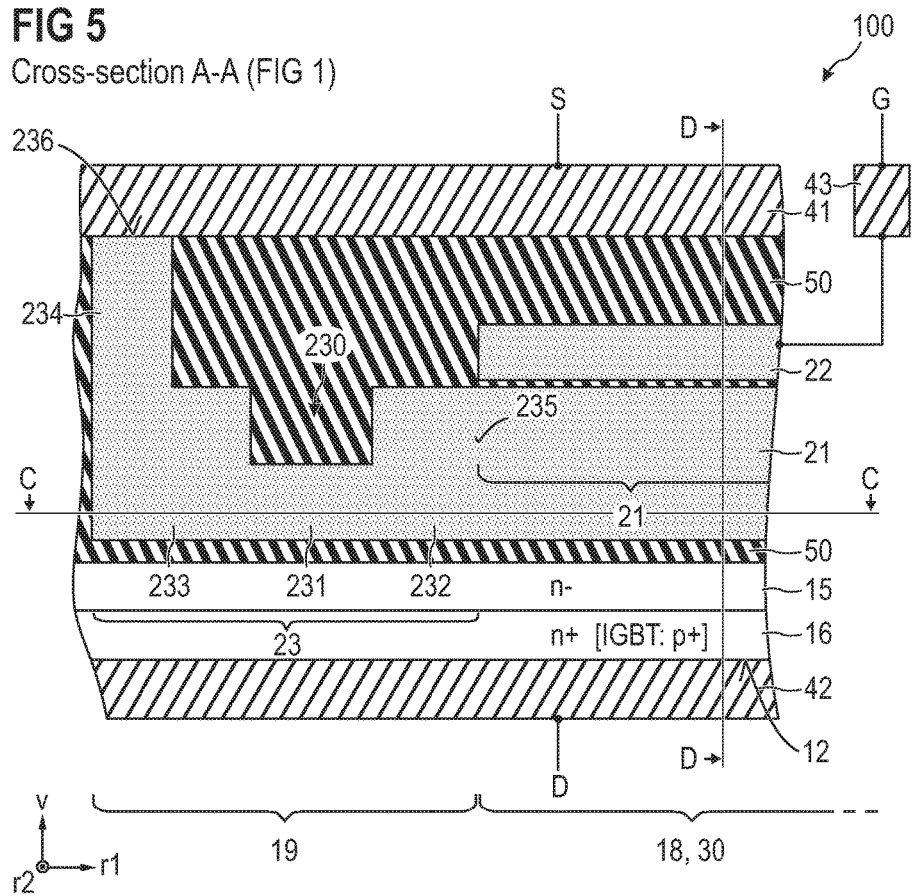
FIG. 5 depicts a vertical cross-sectional view of a section of the arrangement of FIG. 1 having the wiring of FIG. 2, in a sectional plane A-A, illustrating a third example for realizing the resistance sections.

In the following Detailed Description, reference is made to the accompanying drawings, which form a part thereof, and in which is shown by way of illustration specific embodiments in which the invention may be practiced. In this regard, directional terminology, such as "top," "bottom," "front," "back," "leading," "trailing" etc., is used with reference to the orientation of the Figures being described. Because components of embodiments can be positioned in a number of different orientations, the directional terminology is used for purposes of illustration and is in no way limiting. Other embodiments may be utilized and structural or logical changes may be made without departing from the scope of the present invention. The following detailed description, therefore, is not to be taken in a limiting sense, and the scope of the present invention is defined by the appended claims. The features of the various exemplary embodiments described herein may be combined with each other, unless specifically noted otherwise.

FIG. 1 schematically illustrates atop view a semiconductor body 1 of a transistor 100. The semiconductor body 1 includes a typical semiconductor material like silicon (Si), silicon carbide (SiC), gallium arsenide (GaAs), gallium phosphide (GaP), or any other IV-IV, III-V, II-VI semiconductor. The transistor 100 includes a number of transistor cells 30 integrated in the semiconductor body 1. In the illustrated embodiment, the individual transistor cells 30 are realized as strip cells running parallel to one another. However, the individual transistor cells 30 may also have any other cell structure like rectangular, square, hexagonal or arbitrarily polygonal.

The transistor cells 30 are arranged in an active transistor region 18, i.e. in a region of the semiconductor transistor 100 that has the same footprint as all transistor cells 30 together. In this connection, the footprint is to be taken in the plane of the bottom side 12 of the semiconductor body 1, see, e.g., FIG. 3.

The active transistor region 18 of the transistor 100 may consist of only one transistor region, or have two or more transistor regions spaced distant from one another. The active transistor region is a region in which a conductive channel of an insulated gate field effect transistor (IGFET) can be activated, e.g. a source region. Accordingly, the transistor 100 has a non-active transistor region 19 that is defined by the region outside the active transistor region 18 of the transistor 100. The non-active region 19 that may consist of only one transistor region, or have two or more transistor regions spaced distant from one another. In particular, a non-active transistor region 19 may extend from a lateral surface of the transistor 100 as far as an active transistor region 18, and/or between two active transistor regions 18.

As is also illustrated in FIG. 1, for each of the transistor cells 30 there is provided an electrically conductive connection line 23 having a first end 235 and a second end 236. As shown in further detail in in FIG. 2, the first end 235 of each connection line 23 is electrically connected to a first electrode 21 of the respective transistor cell 30 and the second ends 236 are electrically connected to a common contact pad 41 of the transistor 100. Therefore, the second ends 236 are also referred to as 'connecting locations.' For instance, the first electrodes 21 may be field plates, each being arranged underneath one of the gate electrodes of the transistor cells 30, and the common contact pad 41 may be a source pad of the transistor 100. Other embodiments in which the first electrodes are gate electrodes of the transistor cells 30 and the common contact pad is a gate pad of the transistor 100 will be explained with reference to FIG. 13 et seq.

FIG. 3 is a vertical cross-sectional view the arrangement of FIG. 1 having the wiring of FIG. 2, in a sectional plane A-A, illustrating a first example for realizing the resistance sections. The sectional plane A-A runs through a transistor cell 30 having a field electrode 21 and a gate electrode 22 arranged in a common trench formed in the semiconductor body 1. The gate electrode 22 is, together with the gate electrodes of the other transistor cells 30, electrically connected to a common gate contact pad 43.

The semiconductor body 1 has a number of doped semiconductor zones, only two of which are visible in the section (reference numerals 15 and 16). The doped semiconductor zones will be explained below with reference to FIG. 9. The transistor cells 30 are arranged in the active transistor region 18. A dielectric 50 dielectrically insulates the first electrode 21 from the semiconductor zone 15 and from the gate electrode 22. The dielectric 50 may consist of the same dielectric material or be composed of different dielectric materials.

In the present embodiment, the first electrodes 21 serve as field plates that cause a significant portion of the equipotential lines of the electrical potential to run through the comparably thick section of the dielectric 50 between the first electrode 21 and the drift zone 15 substantially parallel to the first electrodes 21.

Each of the first electrodes 21 is electrically connected to a first end 235 of a connection line 23. A second end 236 of the connection line 23 is connected to a contact pad 41 (in this embodiment a source electrode) of the transistor 100. In the sense of the present disclosure, the locations at which the second ends 236 of the connection lines 23 are in physical and electrical contact with a common contact pad (here the source contact pad 41) are also referred to as 'connecting locations' and designated with the same reference numeral (here: 236) as the second ends.

Each of the connection lines 23 include a resistance section 231, an optional section 232 arranged between the resistance section 231 and the first end 735, an optional section 233 arranged both underneath the level of the top side of the first electrode 21 and electrically connected between the resistance section 231 the second end 23, and an optional section 234 arranged between the second end and the level of the top side of the first electrode 21. In this respect, the level of the top side of the first electrode 21 is regarded as the tangent plane running parallel to a bottom side 12 of the semiconductor body 1 through the top sides of the first electrodes 21. The bottom side 12 extends in a plane defined by a first lateral direction r1 and a second lateral direction r2 perpendicular to the first lateral direction r1. A vertical direction v runs perpendicular to both the first and second lateral directions r1, r2.

In the illustrated embodiment, the resistance section 231 has a locally increased specific electric resistance compared to the specific electric resistance of at least any one or both of the sections 232, 233 directly adjacent to the resistance section 231. In other embodiments, the resistance section 231 may be arranged directly adjacent to the first end 235 or, as illustrated in FIG. 4, directly adjacent the second end 236. In the embodiment of FIG. 4, the resistance section 231 extends from the level of the top side of the first electrode 21 as far as the second end 236.

Further, in embodiments, the resistance section 231 may optionally have a locally increased specific electric resistance compared to the specific electric resistance of the respective first electrode 21

In the embodiment illustrated in FIG. 5, the resistance section 231 is formed by a locally reduced cross-sectional area of the connection line 23 which may be achieved, for instance, with a recess 230 that extends into the connection line 23. The recess 230 may extend in the vertical direction v and/or—as illustrated in the horizontal cross-sectional view of FIG. 6—in the horizontal direction r2.

In an embodiment in which the specific electric resistance of the resistance section 231 is locally increased relative to the specific electric resistance of one or both of the sections 232, 233 directly adjacent to the resistance section 231, the resistance section 231 may be made of doped or undoped polycrystalline semiconductor material. Any or all of the sections 232, 233, 234 may be made of doped semiconductor material or of metal.

Accordingly, in any embodiment in which the specific electric resistance of the resistance section 231 is formed by a locally reduced cross-sectional area of the connection line 23, the resistance section 231 may be made of doped or undoped polycrystalline semiconductor material, or of metal. Any or all of the sections 232, 233, 234 may be made of doped or undoped semiconductor material or of metal.

Figure 6:
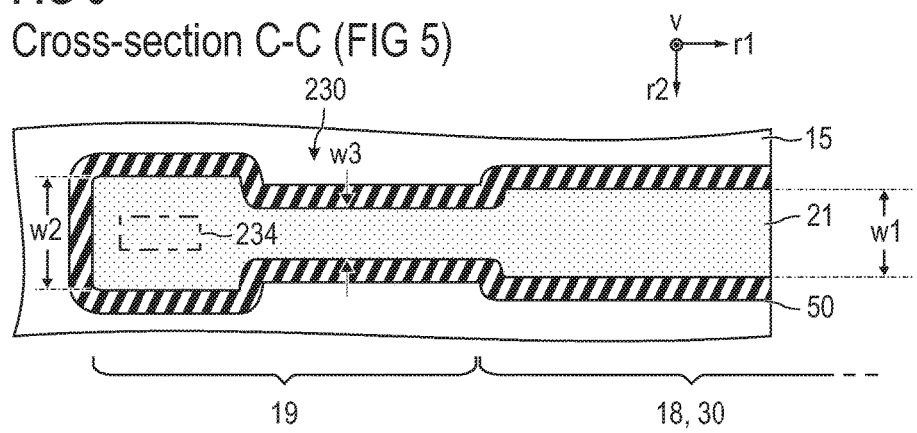
FIG. 6 depicts a horizontal cross-sectional view of the arrangement illustrated in FIG. 5 in a sectional plane C-C.
Figure 8:
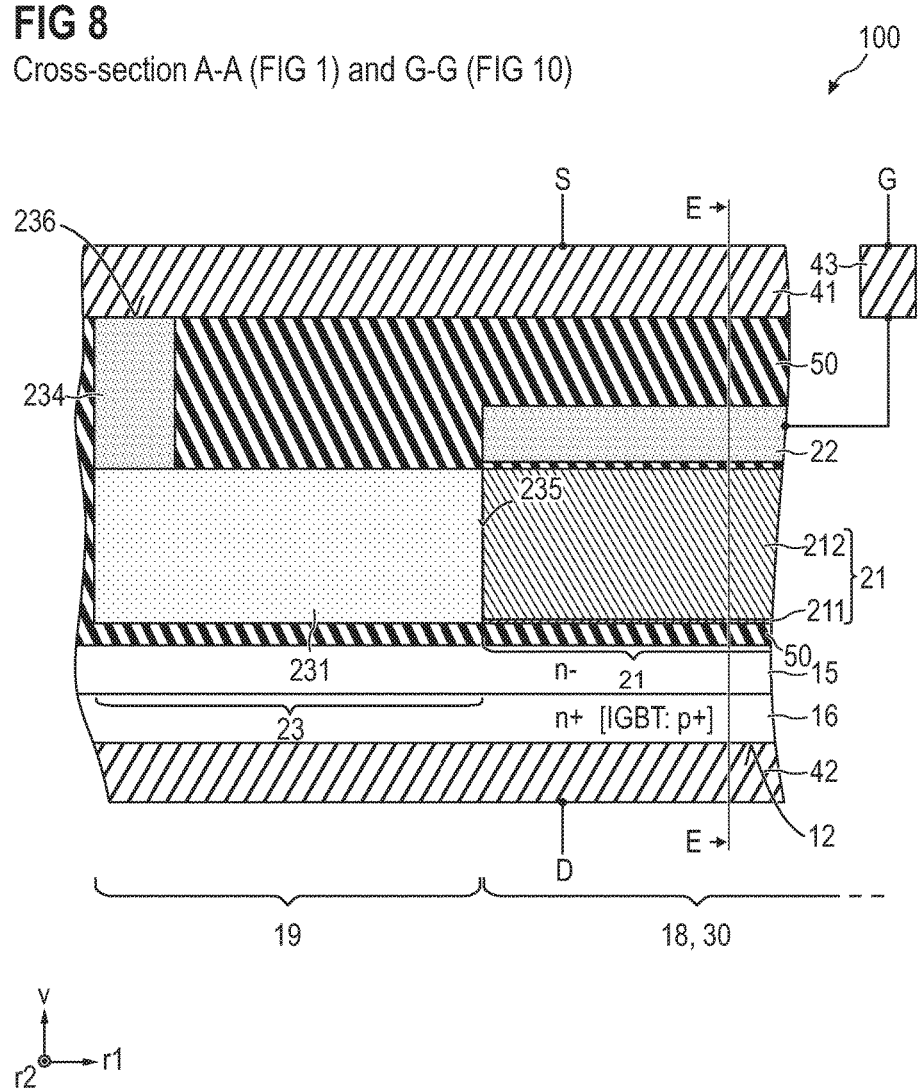
FIG. 8 depicts a vertical cross-sectional view of a section of the arrangements of FIG. 1 having the wiring of FIG. 2, in a sectional plane A-A or of FIG. 10 in a sectional plane G-G, respectively, illustrating a fifth example for realizing the resistance sections.

As may also be seen from FIG. 6, the width of the trench in which the connection line 23 is arranged, may be constant (see also FIG. 8). In FIG. 6, the electrically conductive material that is arranged in the trench formed in the semiconductor body 1 has, in the active transistor region 18, a first width w1, and a second width w2 in the non-active transistor region 19. As illustrated in FIG. 6, the first width w1 may be greater than the second width w2. However, the first width w1 may also be identical to or smaller than the second width w2.

Figure 7:
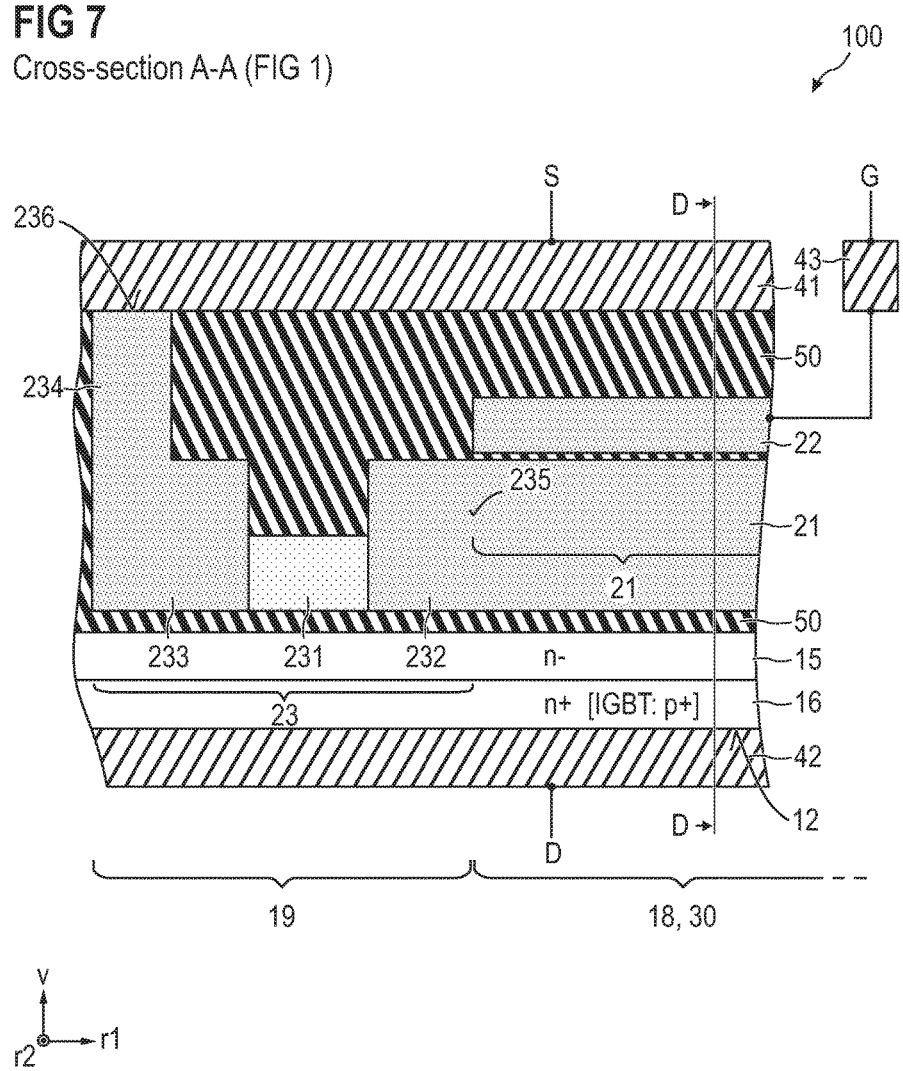
FIG. 7 depicts a vertical cross-sectional view of a section of the arrangement of FIG. 1 having the wiring of FIG. 2, in a sectional plane A-A, illustrating a fourth example for realizing the resistance sections.

As is further illustrated in FIG. 7, a resistance section 231 may be created by both a locally increased specific electric resistance compared to the specific electric resistance of at least any one or both of the sections 232, 233 directly adjacent to the resistance section 231 and a locally reduced cross-sectional area of the connection line 23.

In the embodiment illustrated in FIG. 8, the first electrode 21 is an electrode consisting of or including an electrically conductive material 212, e.g. a metal, for instance tungsten (W). The first electrode 21 may further include a barrier layer 211 arranged in the active transistor region 18 between the electrically conductive material 212 and the semiconductor body 1 in order to prevent the electrically conductive material 212 from significantly diffusing into the semiconductor body 1. In the case that the electrically conductive material is a doped or undoped polycrystalline semiconductor material, e.g., polycrystalline silicon, the barrier layer 211 is dispensable. The barrier layer 211 may be, e.g., a thin layer consisting of or including titanium-nitride (TiN).

The connection line 23 includes a resistance section 231 directly adjacent to the first electrode 21, and a section 234 directly adjacent to the resistance section 231 and extending from the resistance section 231 as far as the common contact pad 41. Both the resistance section 231 and the section 234 comprise doped semiconductor material, whereby the specific electric resistance of the section 234 is lower than the specific electric resistance of the resistance section 231.

Figure 9:
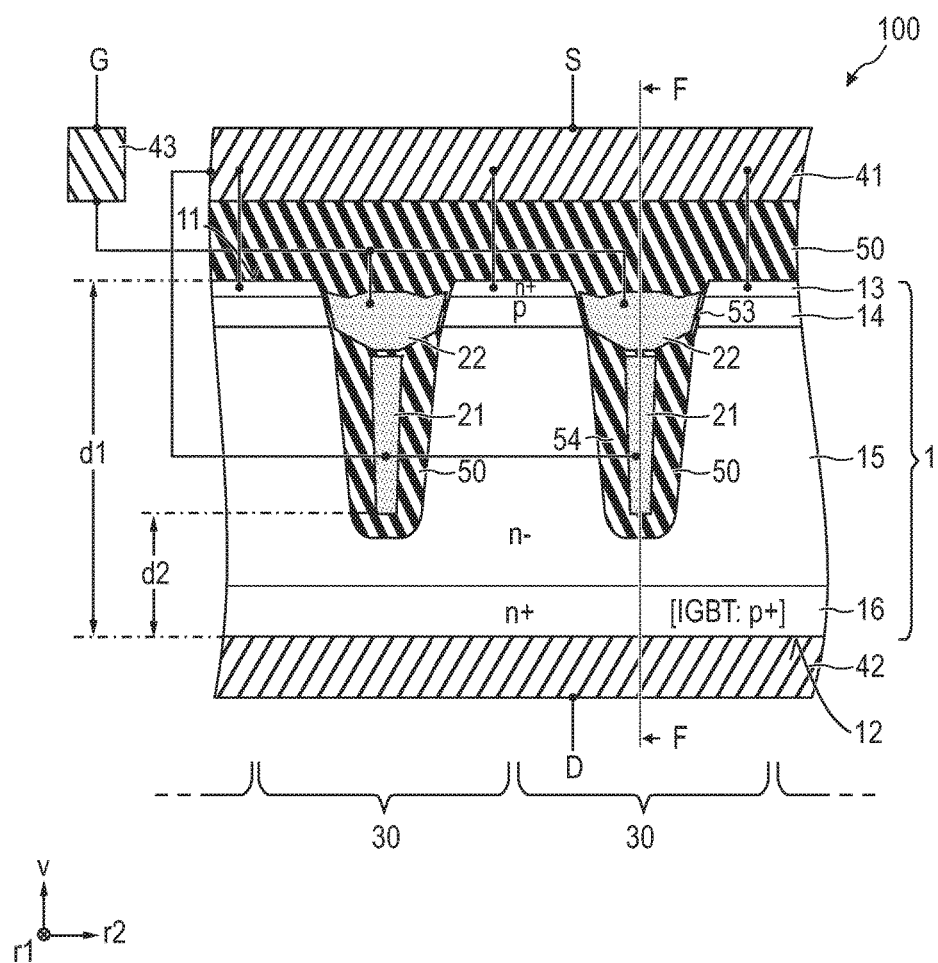
FIG. 9 depicts a vertical cross-sectional view illustrating a first example of a cell structure of the embodiments of FIGS. 1 in a sectional plane B-B and of FIGS. 3, 4, 5, 7, 14, 15, 16 in a sectional plane D-D, respectively.

FIG. 9 is a vertical cross-sectional view taken in the active transistor region 19 and illustrating a first example of a possible cell structure, and of the embodiments of FIG. 1 in a sectional plane B-B or of FIGS. 3, 4, 5, 7, 14, 15, 16 in a sectional plane D-D, respectively. The wiring additionally depicted in FIG. 9 (and also in FIGS. 10, 11, 14 and 18) is only intended to illustrate the electric interconnection between different parts of the transistor 100 and does not contain any information about the physical layout of that wiring.

The transistor 100 includes a semiconductor body 1 with a bottom side 12 and with a top side 11 arranged distant from the bottom side 12 in a vertical direction v. The semiconductor body 1 has a drift zone 15 of a first conduction type, a source zone 13 of the first conduction type and a body zone 14 of a second conduction type which is complementary to the first conduction type. The body zone 14 is arranged between the source zone 13 and the drift zone 15. A drain zone 16 is arranged on that side of the drift zone 15 facing away from the top side 11. The drain zone 16 is doped more highly than the drift zone 15 and can be of the first conduction type, i.e. the same conduction type as the drift zone 15, or can be of the second conduction type. A MOS transistor component formed as a MOSFET is obtained in the case of the former, and a MOS transistor component formed as an IGBT is obtained in the case of the latter. A drain contact pad physically and electrically contacts the drain zone 16.

A doping concentration of the drift zone 15 may be, for example, in the range of $10^{13}$ cm$^{-3}$ to $10^{17}$ cm$^{-3}$, a doping concentration of the source zone 13 may be, for example, in the range of $10^{19}$ cm$^{-3}$ to $10^{20}$ cm$^{-3}$ and a doping concentration of the drain zone 16 lies for example in the range of $10^{19}$ cm$^{-3}$ for a MOSFET and for example in the range of $10^{17}$ cm$^{-3}$ to $10^{19}$ cm$^{-3}$ for an IGBT. In the context of the present disclosure, the term 'doping concentration' is intended to mean the concentration of dopant atoms causing the type of conductivity of a doped semiconductor region.

A contact pad 41 (i.e. a source contact pad) is connected to the source zone 13. The source electrode 41 is composed, for example, of a metal or a highly doped polycrystalline semiconductor material, such as e.g., polysilicon (polycrystalline silicon). Optionally, the source electrode 41 may be connected to the body zone 14 such that the source zone 13 and the body zone 14 are short-circuited, as is known in principle in MOS transistor components.

The transistor cells 30 include pairs each having a gate electrode 22 and a first electrode 21, which is a field electrode. Each pair is arranged in a common trench formed in the semiconductor body 1. The first electrode 21 is arranged between the gate electrode 22 of the respective pair and the bottom side 12 and dielectrically insulated from the respective gate electrode 22. Thereby, the distance between the first electrodes 21 and the bottom side 12 is greater than the distance between the drift zone 15 and the bottom side 12.

The gate electrodes 22, which are arranged adjacent to the body zone 14 and dielectrically insulated from the semiconductor body 1 by a gate dielectric 53, such as, e.g., a semiconductor oxide, which is a part of the dielectric 50, serve for generating a conducting channel in the body zone 14 along the gate dielectric 53 between the source zone 13 and the drift zone 15. That is, the conducting channel is located opposite the surface of the gate dielectric 53 in the body zone 14. The gate dielectric 53 is thinner than a section 54 of the dielectric 50 arranged between the first electrode 21 and the drift zone 15. However, the thickness of section 54, that is, the distance between each of the field plates 21 and the drift region 15, may be less than 5 μm.

As further illustrated in FIG. 9, for each of the first electrodes 21, the difference d1-d2 between a thickness d1 of the semiconductor body 1 and the distance d2 between the first electrode 21 and the bottom side 12 may optionally be at least 0.7 μm.

Figure 10:
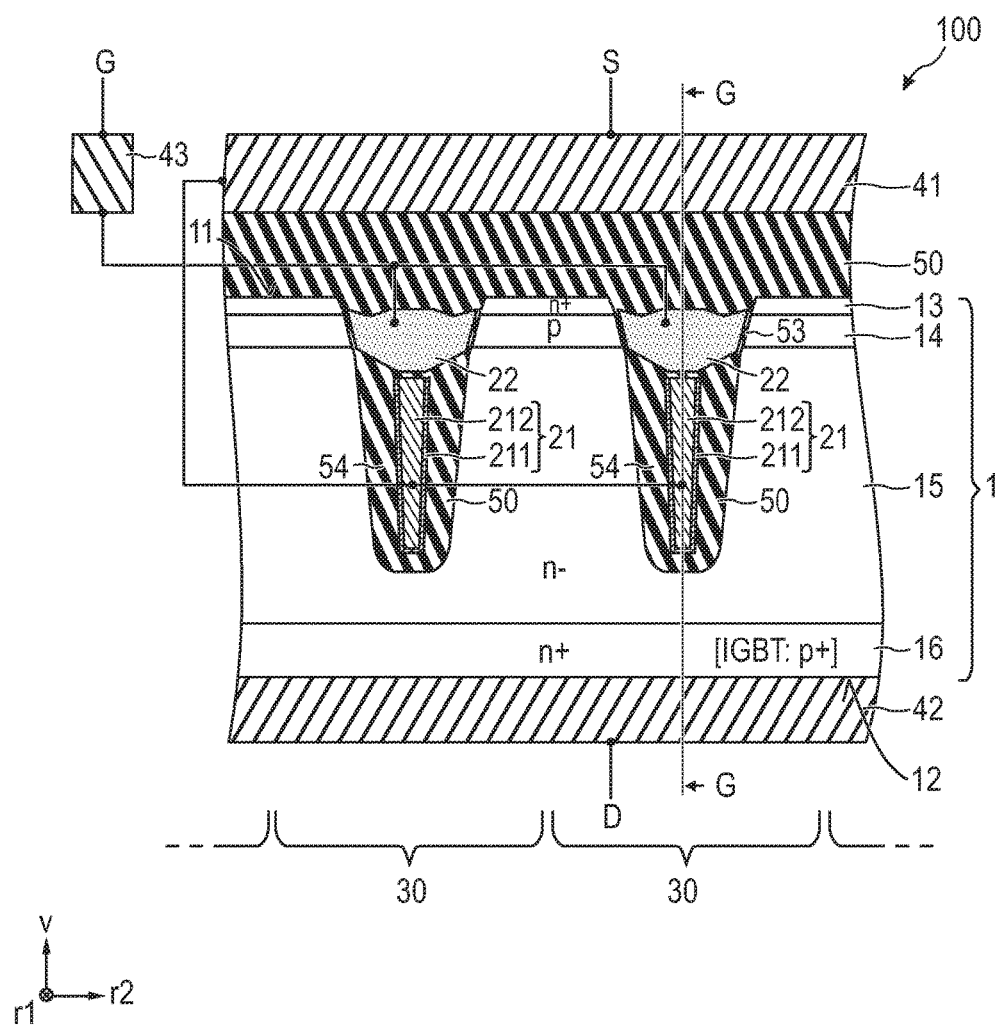
FIG. 10 depicts a vertical cross-sectional view illustrating a second example of a cell structure of the embodiments of FIG. 1 in a sectional plane B-B or of FIGS. 8 and 12 in a sectional plane E-E, respectively.

FIG. 10 is a vertical cross-sectional view taken in the active transistor region 19 of the transistors 100 of FIGS. 8 and 12, respectively, in a sectional plane E-E. The cross-section also corresponds to the sectional plane B-B illustrated in FIG. 1. As can be seen from FIG. 10, the barrier layer 211 may be formed U-shaped and filled with the electrically conductive material 212. If the first electrodes 21 require a high ampacity (which is the case for first electrodes 21 serving as field plates as depicted), the use of a metal for the electrically conductive material 212 allows—compared to a first electrode 21 made of doped polycrystalline semiconductor material (see e.g. FIG. 9) having a higher specific electric resistivity for a reduction of the width of the first electrode 21 and, associated therewith for a reduction of the width of the transistor cells 30. However, for reasons of simplification, the widths of the cells 30 in FIGS. 10 and 9 are shown identical.

FIG. 11 is are more detailed illustration of the embodiment of FIG. 8 and relates to vertical cross-sectional views of FIG. 1 in a sectional plane A-A or of FIG. 10 in a sectional plane G-G, respectively. FIG. 12 is a horizontal cross-sectional view of the arrangement illustrated in FIG. 11 in a sectional plane K-K. 'More detailed' means that the geometry of the depicted elements is closer to a real device than the schematical picture of FIG. 8.

In the previous Figures, the first electrodes were described as field plates 21. However, the same principle may be used in connection with gate electrodes 22 as will be explained now with reference to FIGS. 13 to 19 where the gate electrodes 22 are also referred to as 'first electrodes'.

As may also be seen from FIG. 12, the width of the trench in which the connection line 23 (see also FIG. 1) is arranged, may be but is not necessarily constant. In FIG. 12, the electrically conductive material that is arranged in the trench formed in the semiconductor body 1 has, in the active transistor region 18, a first width w1 that is smaller than a second width w2 that the trench has in the non-active transistor region 19. In order to provide the optional recess 230 as depicted in FIG. 5, the electrically conductive material that is arranged in the trench formed in the semiconductor body 1 may have a third width w3 smaller than the first width w1. Also optionally, the third width w3 may be smaller than the second width w2. In other embodiments, however, the first width w1 may also be identical to or greater than the second width w2.

Figure 13:
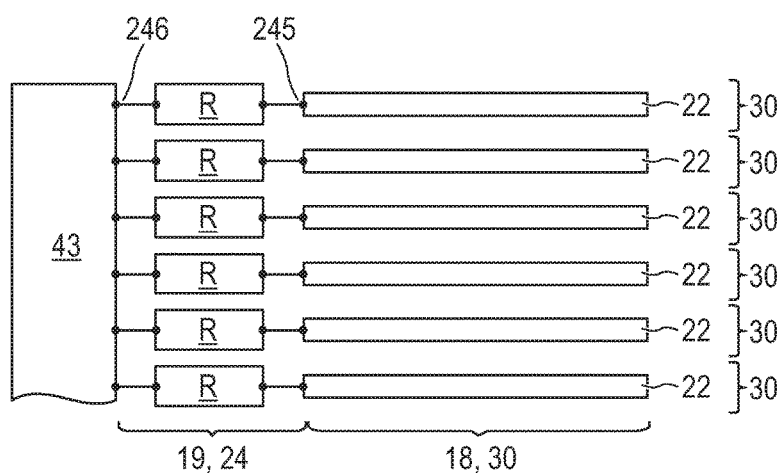
FIG. 13 illustrates, similar to the arrangement of FIG. 2, the wiring of the first electrodes and the connection lines with the integrated resistance sections of the embodiment illustrated in FIG. 1, with the difference that first electrodes are electrically connected, via respective connection lines, to a common gate contact pad.

FIG. 13 illustrates, similar to the arrangement of FIG. 2, the wiring of the first electrodes 22 and the connection lines with the integrated resistance sections of the embodiment illustrated in FIG. 1, with the difference that first electrodes 22 are electrically connected, via respective connection lines 24, to a common gate contact pad 43.

Figure 14:
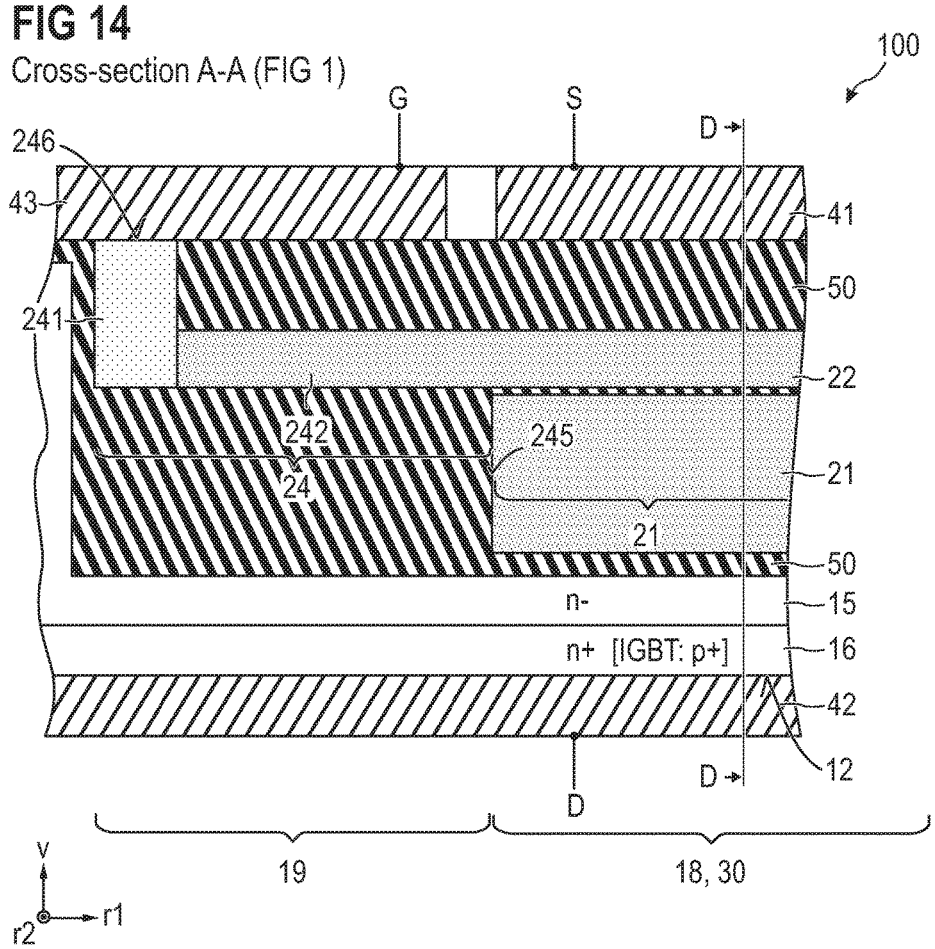
FIG. 14 depicts a vertical cross-sectional view of a section of the arrangement of FIG. 1, having the wiring of FIG. 13, in a sectional plane A-A, illustrating a first example for realizing the resistance sections.

FIG. 14 is a vertical cross-sectional view of a section of the arrangement of FIG. 1 having the wiring of FIG. 3, in a sectional plane A-A, illustrating a first example for realizing the resistance sections 241. The sectional plane A-A runs through a transistor cell 3C having a field electrode 21 and a first electrode 22 (here a gate electrode) arranged in a common trench formed in the semiconductor body 1. The structure of the transistor cells 30 and therefore cross-section in the sectional plane D-D may be the same as explained above with reference to FIG. 9.

The transistor cells 30 are also arranged in the active transistor region 18. The field electrode 21 is, together with the field electrodes 21 of the other transistor cells 30, electrically connected to a common contact pad 41, the source contact pad.

In the present embodiment, the first electrodes 22 serve as gate electrode and have the function of creating an electrically conductive channel in the body zone 14 as described above. Each of the first electrodes 22 is electrically connected to a first end 245 of a connection line 24. A second end 246 of the connection line 24 is connected to a contact pad 43 of the transistor 100, in this embodiment a gate contact pad. In the sense of the present disclosure, the locations at which the second ends 246 of the connection lines 24 are in physical and electrical contact with a common contact pad (here the gate contact pad 43) are also referred to as 'connecting locations' and designated with the same reference numeral (here: 246) as the second ends.

Each of the connection lines 24 includes a resistance section 241, and an optional section 242 arranged between the resistance section 241 and the first end 245. The resistance section 241 has a locally increased specific electric resistance compared to the specific electric resistance of the section 242 directly adjacent to the resistance section 241. In other embodiments, the resistance section 241 may be arranged directly adjacent to the first end 245 or spaced distant from both the first and second ends 245, 246. The connection lines 24 may be made of doped polycrystalline semiconductor material that has a reduced doping concentration in the region of the resistance section 241 such that the resistance section 241 has a reduced specific electric resistivity compared with the specific electric resistivity of the section 242.

In the embodiment illustrated in FIG. 15, the resistance section 241 is formed by a locally reduced cross-sectional area of the connection line 24 which may be achieved, for instance, with a recess 240 that extends into the connection line 24. The recess 240 may extend in the vertical direction v and/or—in the same manner as illustrated in the horizontal cross-sectional view of FIG. 6 for the recess 230—in the horizontal direction r2. As can also be seen from FIG. 15, the connection line 24 may comprise one or more further resistance sections 242, 243 and 244.

In the embodiment illustrated in FIG. 16, the resistance section 241 is formed by combining the principles described above with reference to FIGS. 14 and 15, that is, by a locally reduced cross-sectional area of the connection line 24 in the region of the resistance section 241 and by a locally increased specific resistance in the region of the resistance section 241.

In FIGS. 14, 15 and 16, the cross-sectional view in the cross-sectional plane D-D is the same as explained above with reference to FIG. 9.

A number of embodiments for electrically connecting a first electrode to a contact pad have been explained, for example, using a field electrode or field plate 21 connected to source contact pad 41 and for a gate electrode 22 connected to gate contact pad 43. The principles, designs and materials mentioned with reference to the connection between the field electrode or field plate 21 and a source contact pad 41 may also apply to the connection between a gate electrode 22 and a gate contact pad 43. Vice versa, the principles, designs and materials mentioned with reference to the connection between the gate electrode and a gate contact pad 41 may also apply to the connection between a field electrode or field plate 22 and a source contact pad 41.

Further, the first conduction type may be 'n' and the second conduction type may be 'p' as illustrated throughout the drawings. Alternatively, in other embodiments the first conduction type may be 'p' and the second conduction type may be 'n'.

The source, drain and gate contact pads 41, 42 and 43 mentioned in the above description may be exposed at the surface of the transistor chip 100 to allow for an external electrical connection. Those pads 41, 42 and 43 may consist of or comprise a metal like aluminum, an aluminum alloy, copper, a copper alloy, or consist of or comprise doped polycrystalline semiconductor material.

According to a further optional aspect, each of the first electrodes 21, 22 may have, in a first lateral direction r1 perpendicular to the vertical direction v, a first resistivity per length, and each of the connection lines 23, 24 may have in its resistance region 231, 241 and also in the first lateral direction r1, a second resistivity per length. Thereby, for each of the connection lines 23, 24, the ratio between the second resistivity per length and the first resistivity per length of the first electrode 21, 22 contacting the respective connection line 23, 23 may be greater than 1.

A semiconductor chip according to the present embodiments may, but is not necessarily required to, use the charge compensation principle. That is, inter alia, a semiconductor chip 100 according to the present disclosure may have or have not field plates as initially described. Further, a gate electrode 21 of a semiconductor chip according to the present disclosure may, but is not necessarily required to, be arranged in a trench formed in the semiconductor body of the semiconductor chip. That is, inter alia, a gate electrode may also be a so-called "planar gate electrode" or "plane gate electrode" arranged on the top side of the semiconductor chip's semiconductor body. An example for a semiconductor chip 100 comprising a cell structure with planar gate electrodes 22 is illustrated in FIG. 17 which is a cross-sectional view in a plane B-B as illustrated in FIG. 1. The planar gate electrodes 22, which may run parallel to one another in a direction r1 perpendicular to the drawing plane, are arranged above top side 11 of the semiconductor body 1 but not in a trench formed in the semiconductor body 1. The source contact pad 41 directly contacts the source zones 13. The body zones 14 directly connect both the source zones 13 and the drift zone 15. The dielectric 50 electrically insulates the gate electrodes 22 from both the semiconductor body 1 and the source pad 41.

Apart from the facts that the gate electrodes 22 are not arranged in trenches formed in the semiconductor body 1, and that the semiconductor chip 100 has no field electrodes for realizing a compensation component, the electrical resistance of the gate electrodes and the connection lines 24 electrically connecting the gate electrodes 22 to the gate pad 43 may be adjusted in the same manner as described above, i.e., by providing a recess 240 in the connection line 24 as explained with reference to FIG. 15, and/or by providing different resistance sections 241, 242, 243 as explained with reference to FIGS. 14 to 16.

Referring now to FIGS. 18A to 22A, various steps of a method for producing a first electrode 30 and a connection line 23 electrically connected to that first electrode 30 as used are illustrated. Such a method may be used, for instance, for producing the semiconductor component 100 illustrated in FIGS. 11 and 12. FIGS. 18A, 19A, 20A and 21A are cross-sectional views of the arrangements shown in FIGS. 18B, 19B, 20B and 21B, respectively, in the same cross-sectional plane K-K.

Figure 18A:
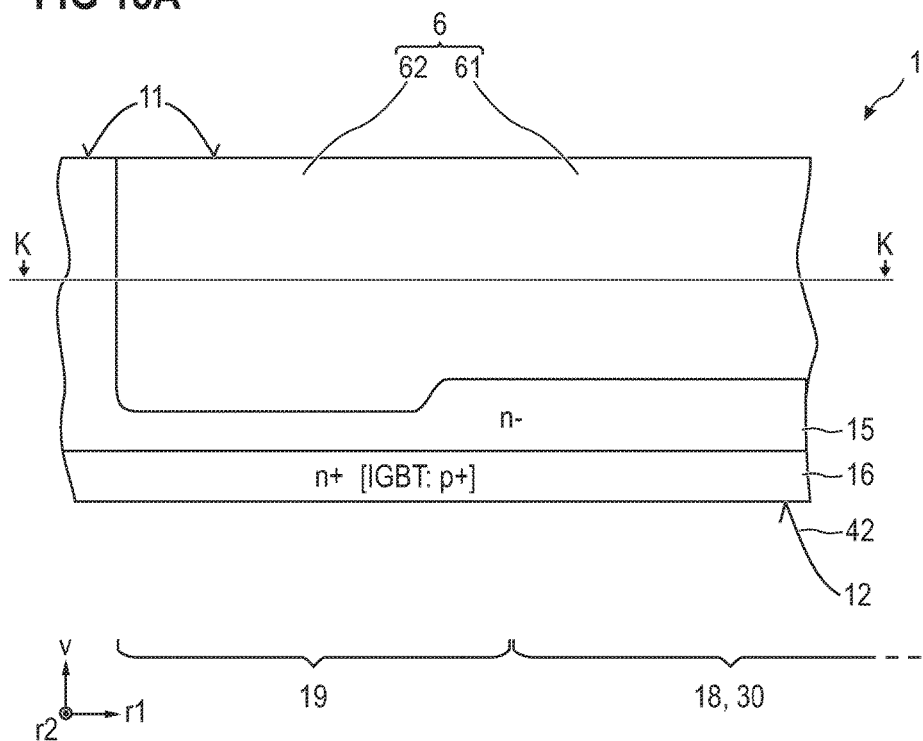
FIGS. 18A-22B depict various steps of a method for producing a first electrode and a connection line electrically connected thereto.
Figure 18B:
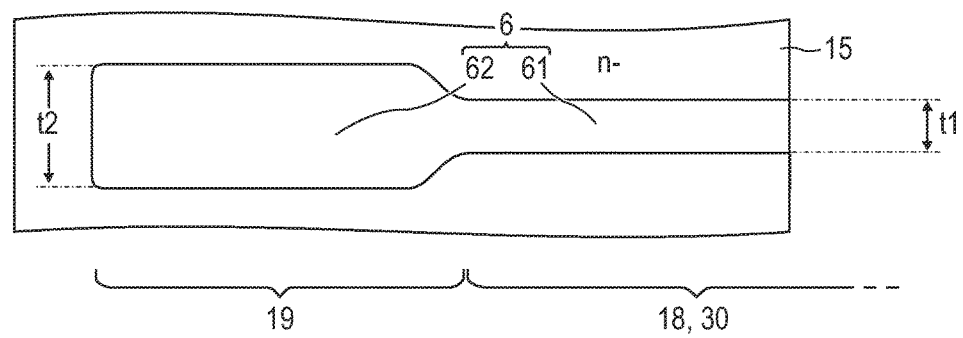

According to FIGS. 18A and 18B, a trench 6 is produced in the semiconductor body 1 by anisotropically masked etching. The trench 6 extends into the semiconductor body 1 from the top side 11 of the semiconductor body 1 towards the bottom side 12 of the semiconductor body 1. For etching, a mask overlaying the top side 11 and having an opening in the area of the trench 6 to be etched may be used.

The trench 6 has a first section 61 arranged in the area of the active transistor region 18 to be produced, and a second section 62 arranged in the area of the non-active transistor region 19 to be produced. In the first section 61, the trench 6 has first width t1, and in the second section 62, a second width t2 greater than the first width t1. FIGS. 18A and 18B illustrate the arrangement after completing the trench 6.

Figure 19A:
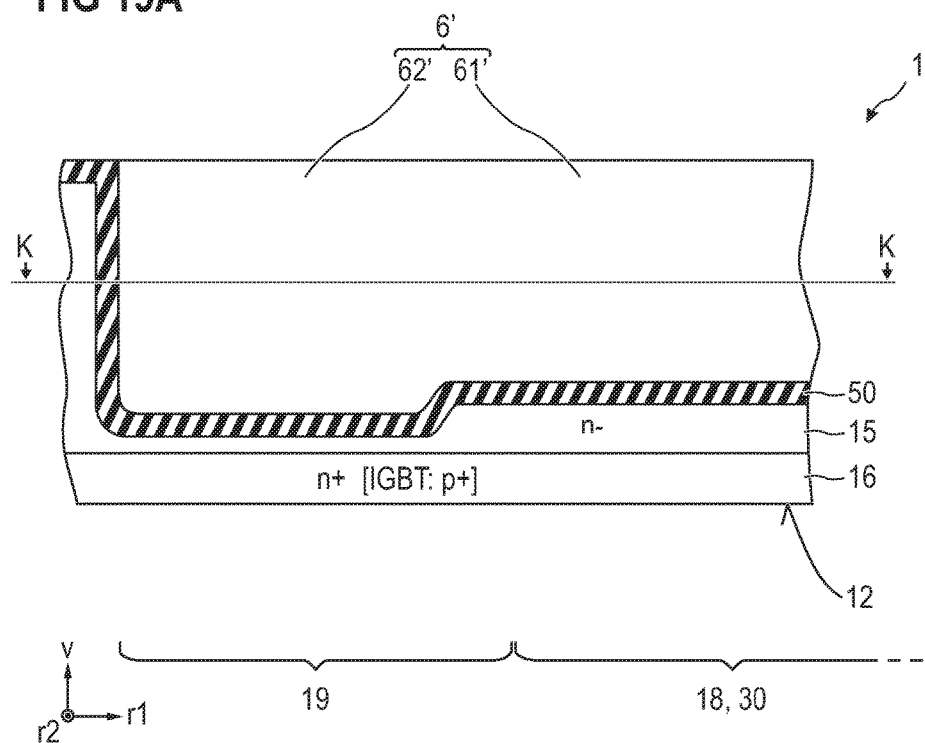
Figure 19B:
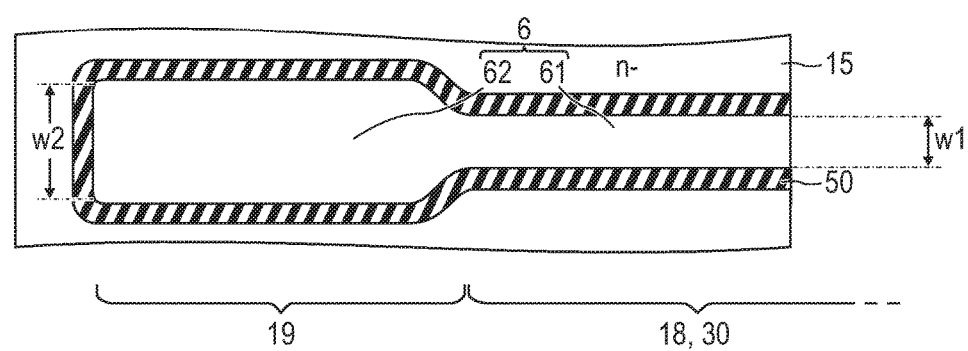
Figure 20A:
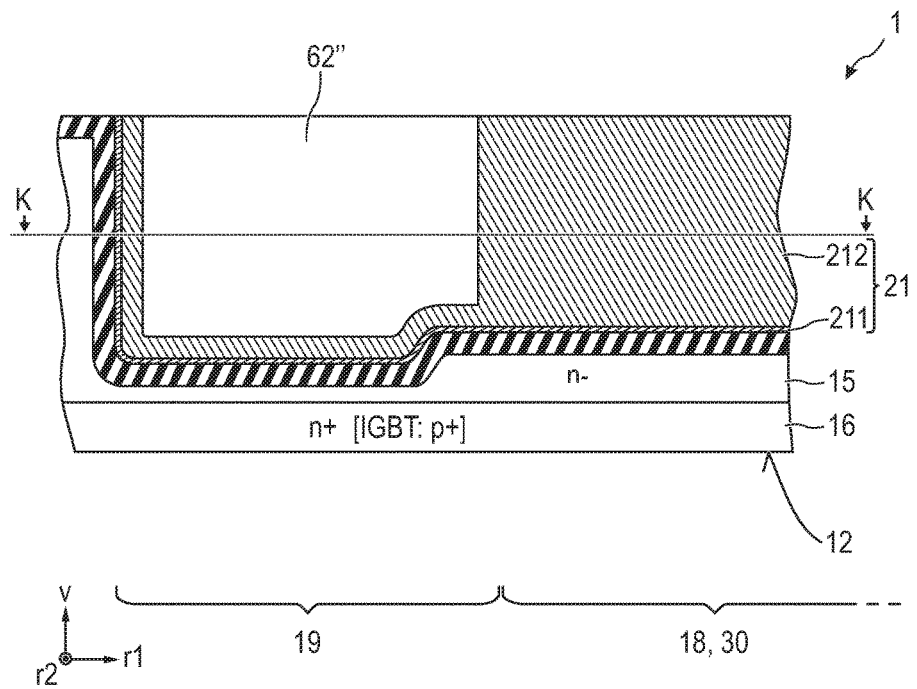
Figure 20B:
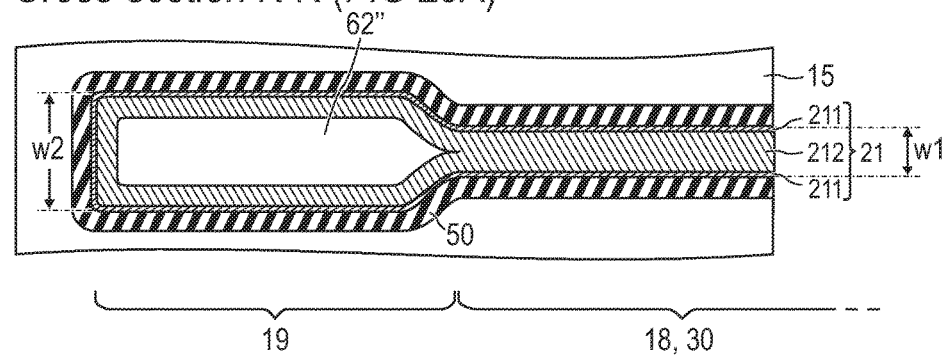

Subsequently, as illustrated in FIGS. 19A and 19B, a dielectric layer 50 covering the surface of the trench 6 is produced. For instance, the dielectric layer 50 may be produced by thermally oxidizing a surface layer of the semiconductor body 1. Alternatively, the dielectric layer 50 may be formed by conformally depositing a dielectric material on the surface of the trench 6. In any case, after the dielectric layer 50 is completed, the remaining trench 6' has, in the active transistor region 18 to be produced, a first width w1, and in the non-active transistor region 19 to be produced, a second width w2 greater than the first width w1.

Then, one or more electrically conductive layers 211, 212 of one or more first electrically conductive material are conformally deposited in the remaining trench 6' on the surface of the dielectric layer 50 such that the remaining trench 6' is completely filled in the active transistor region 18 to be produced (i.e. in the first section 61 of the previous trench 6), and that the remaining trench 6' is not completely filled in the non-active transistor region 19 to be produced (i.e. in the second section 62 of the previous trench 6). As a result illustrated in FIGS. 20A and 20B, the previous second section 62 is completely filled, whereas a section 62" of the former trench 6 remains unfilled.

Figure 21A:
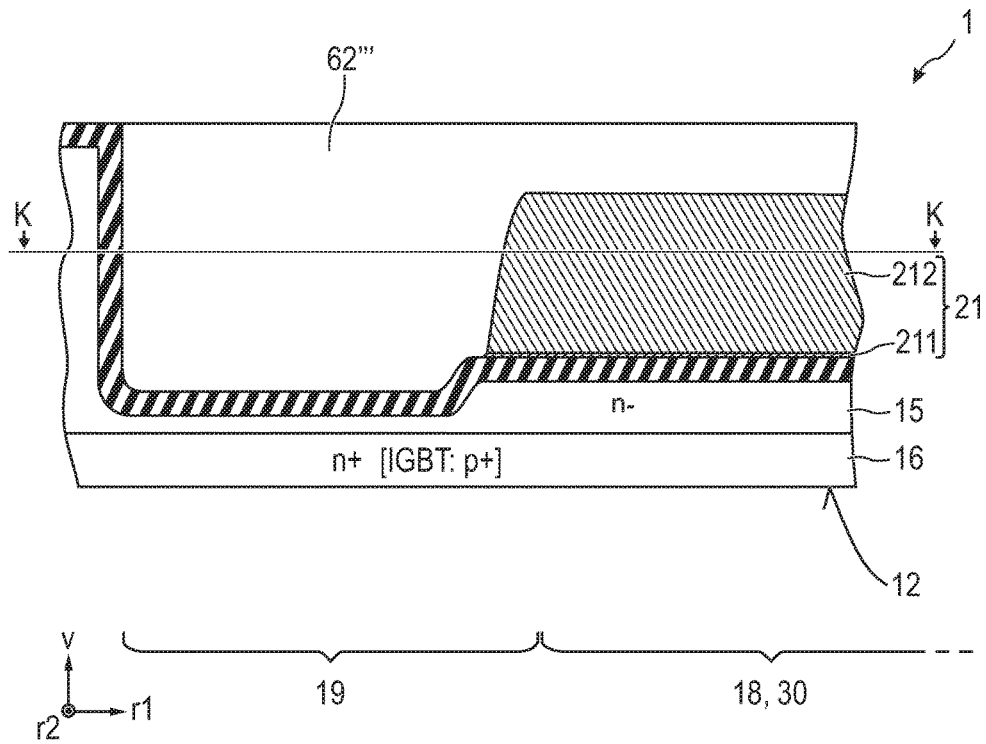
Figure 21B:
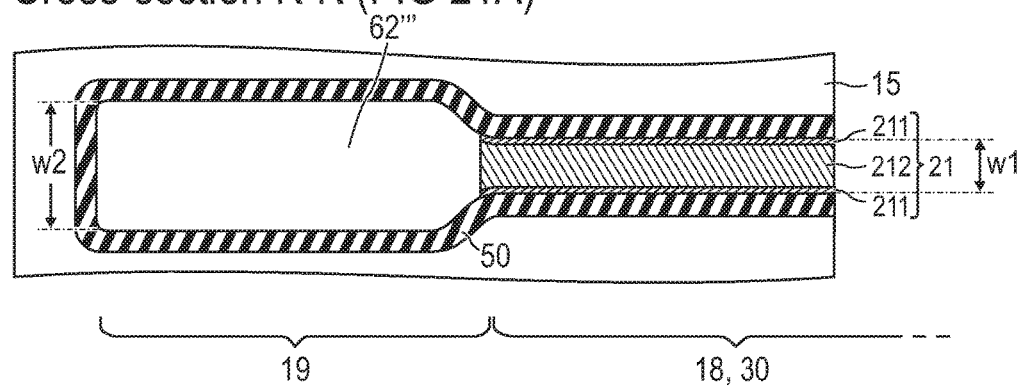

In a subsequent step, the electrically conductive layers 211, 212 may be isotropically etched such that the layers 211, 212 are completely removed in the non-active transistor region 19 to be produced, and only partially in the active transistor region 18 to be produced. In any case, as can be seen in FIGS. 21A and 21B, a continuous layer of the dielectric material 50 overlaying the surface of the former trench 6 in the non-active transistor region 19 to be produced remains. In the non-active transistor region 19 to be produced, a section 62''' of the former trench 6 remains unfilled.

Figure 22A:
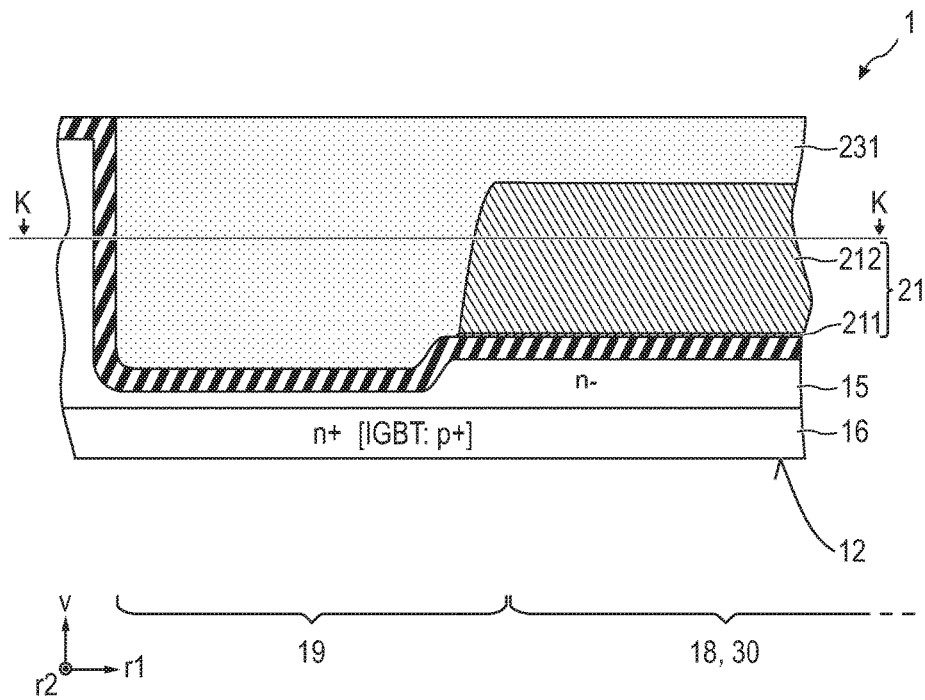
Figure 22B:
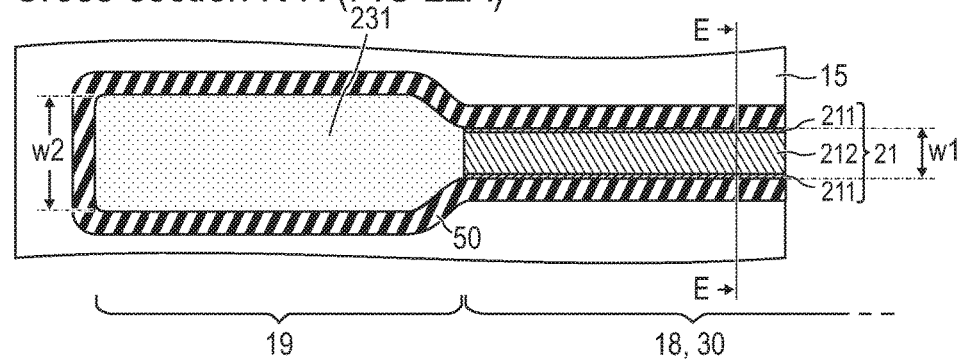

Subsequently, the section 62''' is filled with a second electrically conductive material 231. The result is illustrated in FIGS. 22A and 22B. The second electrically conductive material 231 may be different from at least one of the first electrically conductive materials 211, 212. A remainder of the first electrically conductive material(s) 211, 212 arranged in the active transistor region 18 to be produced forms the first electrode 30. Accordingly, a remainder of the second electrically conductive material(s) 231 arranged in the non-active transistor region 19 to be produced forms the connection line 23, or a part of a connection line 23.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor chip, comprising:
a semiconductor body with a bottom side and with a top side arranged distant from the bottom side in a vertical direction;
an active transistor region and a non-active transistor region;
a drift region formed in the semiconductor body;
a contact terminal pad for externally contacting the semiconductor chip;
a plurality of transistor cells formed in the semiconductor body, wherein each of the transistor cells comprises a first electrode; and
a plurality of connection lines, each of which electrically connects another one of the first electrodes to the contact terminal pad at a connecting location of the respective connection line, wherein each of the connection lines comprises a resistance section formed of a locally increased specific resistance relative to a specific resistance of adjacent semiconductor material or metal of the respective connection line; and wherein each of the connecting locations and each of the resistance sections is arranged in the non-active transistor region.

2. The semiconductor chip of claim 1, wherein each of the first electrodes is arranged in a trench formed in the semiconductor body.

3. The semiconductor chip of claim 1, wherein
the transistor cells comprise an elongated shape; and
the first electrodes of the transistor cells comprise an elongated shape and run parallel to one another in a lateral direction perpendicular to the vertical direction.

4. The semiconductor chip of claim 1, wherein each of the connecting lines comprises a first recess in the resistance section.

5. The semiconductor chip of claim 1, wherein each of the connecting lines comprises, in the resistance section, at least one of:
a first recesses extending, in a direction parallel to the vertical direction, into the respective connection line; and
a second recesses extending, in a direction perpendicular to the vertical direction, into the respective connection line.

6. The semiconductor chip of claim 1, wherein each of the connecting lines comprises, in the resistance section, a specific electric resistance that is higher than at least one of:
a specific electric resistance of a first section of the conductor line, wherein the first section is electrically connected between the resistance section and the respective first electrode; and
a specific electric resistance of a second section of the conductor line, wherein the second section is electrically connected between the resistance section and the contact terminal pad.

7. The semiconductor chip of claim 6, wherein the first section of each of the connection lines comprises a doped polycrystalline semiconductor material.

8. The semiconductor of claim 1, wherein
each of the connecting lines comprises a first section of the conductor line, wherein the first section is electrically connected between the resistance section and the respective first electrode;
the resistance section comprises doped polycrystalline semiconductor material having a first doping concentration;
the first section comprises doped polycrystalline semiconductor material having a second doping concentration; and
the second doping concentration is higher than the first doping concentration.

9. The semiconductor chip of claim 1, wherein
each of the connecting lines comprises a second section of the conductor line, wherein the second section is electrically connected between the resistance section and the connecting location of the respective connection line;

the resistance section comprises doped polycrystalline semiconductor material having a first doping concentration;

the second section comprises doped polycrystalline semiconductor material having a third doping concentration; and the third doping concentration is higher than the first doping concentration.

10. The semiconductor chip of claim 1, comprising a source metallization arranged on the top side and a drain metallization arranged on the bottom side.

11. The semiconductor chip of claim 1, wherein each of the first electrodes comprises a second recess extending from that side of the respective first electrode facing away from the bottom side into the respective first electrode and being filled with a dielectric filling comprising a solid.

12. The semiconductor chip of claim 1, wherein
each of the first electrodes comprises, in a first lateral direction perpendicular to the vertical direction, a first resistivity per length;
each of the connection lines comprises in its resistance region in the first lateral direction a second resistivity per length; and
for each of the connection lines, the ratio between the second resistivity and the first resistivity of the first electrode contacting the respective connection line is greater than 1.

13. The semiconductor chip of claim 1, comprising a plurality of trenches formed in the semiconductor body, wherein, in each of the trenches, one of the first electrodes and the connection line that electrically connects the first electrode to the contact terminal pad are arranged.

14. The semiconductor chip of claim 13, wherein an electrically conductive material arranged in each of the trenches has, in a first section wherein the respective first electrode is arranged, a first width, and in a second section in which the respective connection line is arranged, a second width that is wider than the first width.

15. The semiconductor chip as claimed in claim 14, wherein
each of the first electrodes and the connection line that electrically connects the first electrode to the contact terminal pad form a continuous composite conductor;
each of the composite conductors has a boundary location at which the first electrode of that composite conductor is in physical contact with the connection line of that composite conductor; and
each of the composite conductors has, in a lateral direction from the respective first electrode to the respective connection line, a resistivity per length that increases at the boundary location by a factor of at least 2.

16. The semiconductor chip of claim 1, wherein the resistance section is arranged between and directly adjoins the contact terminal pad and the adjacent semiconductor material.

17. The semiconductor chip of claim 1, wherein each of the first electrodes is one of the source electrodes and the contact terminal pad is the source electrode pad.

18. A semiconductor chip, comprising:
a semiconductor body with a bottom side and with a top side arranged distant from the bottom side in a vertical direction;
an active transistor region and a non-active transistor region;
a drift region formed in the semiconductor body;
a contact terminal pad for externally contacting the semiconductor chip;
a plurality of transistor cells formed in the semiconductor body, wherein each of the transistor cells comprises a first electrode;
a plurality of connection lines, each of which electrically connects another one of the first electrodes to the contact terminal pad at a connecting location of the respective connection line, wherein each of the connection lines comprises a resistance section formed of at least one of: a locally reduced cross-sectional area of semiconductor material relative to a cross-sectional area of adjacent semiconductor material of the respective connection line; a locally increased specific resistance relative to a specific resistance of adjacent semiconductor material or metal of the respective connection line; and wherein each of the connecting locations and each of the resistance sections is arranged in the non-active transistor region; and
a source electrode pad, field electrodes electrically connected to the source electrode pad, a gate electrode pad, and gate electrodes electrically connected to the gate electrode pad.

19. A semiconductor chip, comprising:
a semiconductor body with a bottom side and with a top side arranged distant from the bottom side in a vertical direction;
an active transistor region and a non-active transistor region;
a drift region formed in the semiconductor body;
a contact terminal for externally contacting the semiconductor chip;
a plurality of transistor cells formed in the semiconductor body, wherein each of the transistor cells comprises a first electrode; and
a plurality of connection lines, each of which electrically connects another one of the first electrodes to the contact terminal pad at a connecting location of the respective connection line, wherein each of the connection lines comprises a resistance section formed of at least one of: a locally reduced cross-sectional area; and a locally increased specific resistance, wherein each of the connecting locations and each of the resistance sections are arranged in the non-active transistor region,
wherein each of the resistance sections are disposed within the semiconductor body.

20. The semiconductor chip of claim 19, wherein each of the connection lines in the plurality are completely disposed within the semiconductor body.

* * * * *